(12) United States Patent
Vangara

(10) Patent No.: US 11,611,316 B2
(45) Date of Patent: Mar. 21, 2023

(54) LOAD REGULATION FOR LDO WITH LOW LOOP GAIN

(71) Applicant: pSemi Corporation, San Diego, CA (US)

(72) Inventor: Satish Vangara, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 218 days.

(21) Appl. No.: 17/084,455

(22) Filed: Oct. 29, 2020

(65) Prior Publication Data

US 2022/0140791 A1    May 5, 2022

(51) Int. Cl.
| | |
|---|---|
| G05F 1/46 | (2006.01) |
| H03F 1/30 | (2006.01) |
| H03F 1/02 | (2006.01) |
| G05F 1/575 | (2006.01) |

(52) U.S. Cl.
CPC ............. *H03F 1/303* (2013.01); *G05F 1/468* (2013.01); *G05F 1/575* (2013.01); *H03F 1/0227* (2013.01); *H03F 2200/451* (2013.01)

(58) Field of Classification Search
CPC ... G05F 1/46; G05F 1/468; G05F 1/56; G05F 1/563; G05F 1/565; G05F 1/575; H02M 1/0003; H02M 1/0025; H03M 1/0607; H03M 1/0609; H03M 1/1023; H03M 1/1028; H03F 1/303; H03F 1/0227; H03F 2200/451

See application file for complete search history.

(56) References Cited

U.S. PATENT DOCUMENTS 6,201,375 B1 * 3/2001 Larson .................... G05F 1/573
                                                                            323/280

* cited by examiner

*Primary Examiner* — Long Nguyen
(74) *Attorney, Agent, or Firm* — Jaquez Land Greenhaus & McFarland LLP; John Land, Esq.

(57) ABSTRACT

Circuits and methods for maintaining loop stability and good load regulation in low loop gain LDO regulator circuits. Embodiments encompass LDO regulator circuits that include an offset error correction circuit that generates an opposing voltage $V_{OFFSET}$ as a function of load current to substantially cancel out variations in $V_{OUT}$ that would otherwise occur due to load regulation limitations of the LDO regulator circuits. Embodiments use $V_{OFFSET}$ to imbalance currents in differential paths in a last-stage LDO error-amplifier so that an offset is propagated to a pair of inputs to the error-amplifier, thereby altering the output voltage $V_{OUT}$ to a corrected value. Benefits include improved LDO load regulation even when feedback loop gain is low, the available of both digital and analog implementations, high LDO accuracy and less variation of the output voltage $V_{OUT}$, and suitability for implementation in integrated circuits for applications such as high precision power supplies.

15 Claims, 13 Drawing Sheets

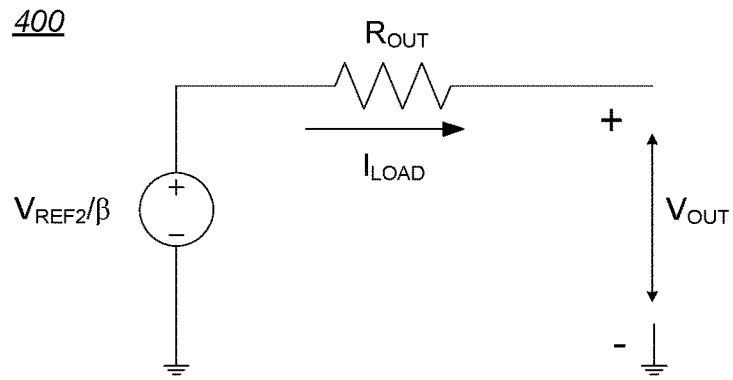
FIG. 4A
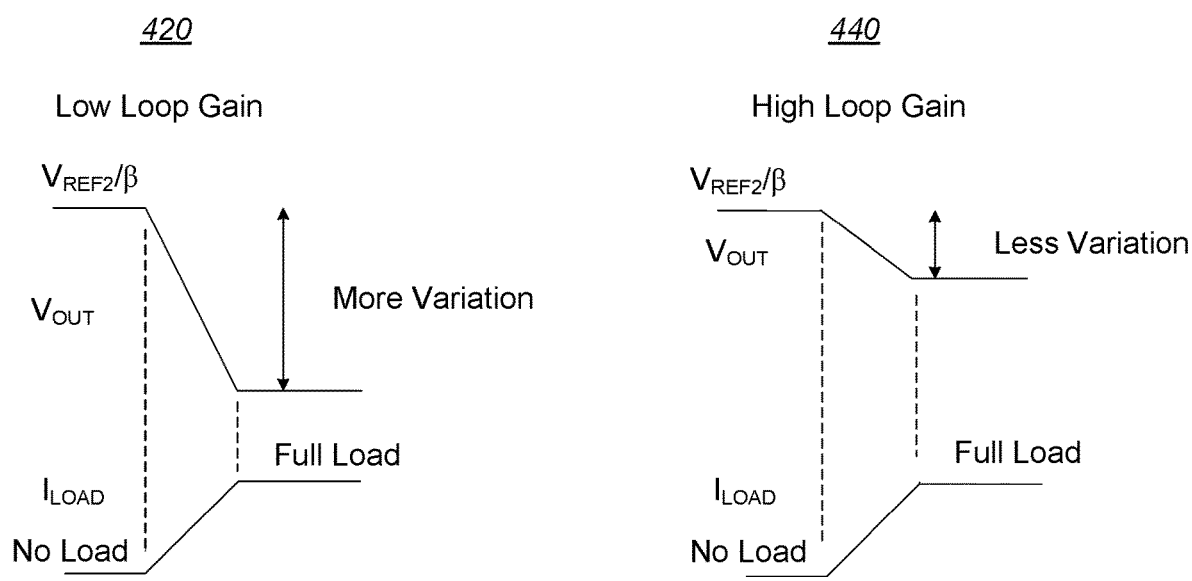
FIG. 4B     FIG. 4C

*1200*

For an LDO regulator circuit that includes an input for a voltage and an output for a regulated voltage $V_{OUT}$, generating an offset correction signal as a function of a load current $I_{LOAD}$ through the LDO regulator circuit and applying the offset correction signal to the LDO regulator circuit to substantially cancel out variations in $V_{OUT}$ resulting from a low feedback loop gain of the LDO regulator circuit — 1202

For an LDO regulator circuit that includes an input for a voltage and an output for a regulated voltage $V_{OUT}$, generating an offset current $I_{OFFSET}$ as a function of a load current $I_{LOAD}$ through the LDO regulator circuit — 1302

Applying the offset current $I_{OFFSET}$ to an error amplifier having a first differential input and a second differential input controlling the generation of the regulated voltage $V_{OUT}$, such that the first differential input passes a current reduced by the offset current $I_{OFFSET}$ and the second differential input passes a current increased by the offset current $I_{OFFSET}$, thereby substantially cancelling out variations in $V_{OUT}$ that would otherwise occur due to load regulation limitations of the LDO regulator circuit — 1304

FIG. 13

LOAD REGULATION FOR LDO WITH LOW LOOP GAIN

BACKGROUND

(1) Technical Field

This invention relates to electronic circuitry, and more particularly to regulator circuits for switched-mode power supplies.

(2) Background

An electronic switched-mode power supply (SMPS) transfers power from a DC or AC source to DC loads, such as the electronic components within a personal computer or cellular phone, while converting voltage and current characteristics. Voltage regulation is achieved by varying the ratio of ON-to-OFF time of a pass transistor rather than by power dissipation, as in linear power supplies, resulting in high power conversion efficiency. Switched-mode power supplies may also be substantially smaller and lighter than a linear power supply, and accordingly are quite useful in portable electronic devices.

The characteristic switching operation of an SMPS means that the output voltage of the SMPS is not flat, but includes a ripple voltage. A ripple voltage is very undesirable when powering noise-sensitive circuitry, particularly radio frequency (RF) circuitry. Accordingly, the output of an SMPS is generally regulated to suppress or eliminate the ripple voltage.

For example, FIG. 1 is a block diagram 100 of a generalized prior art electronic circuit powered by an SMPS 102. As illustrated, the SMPS 102 outputs a supply voltage 104 that includes a ripple voltage. A low drop-out (LDO) regulator 106 having a sufficiently high Power Supply Rejection Ratio (PSRR) filters out the SMPS output voltage ripples and provides an essentially constant DC power output voltage 108. PSRR is a conventional measure of the capability of an LDO regulator circuit 106 to suppress any power supply variations to its output signal, and may be expressed as PSRR=Av/Avo, where Av=the open-loop gain of a regulator feedback loop, and Avo=the Vout/Vin gain of the circuit. The "clean" voltage output from the LDO regulator circuit 106 may then be provided to noise-sensitive circuitry 110, which may be, for example, RF circuitry including mixers, low noise amplifiers (LNAs), phase locked loops (PLLs), voltage controlled oscillators (VCOs), etc.

An LDO regulator circuit is a DC linear voltage regulator that can regulate an output voltage even when the supply voltage is very close to the output voltage. LDO regulator circuits avoid switching noise (as no switching takes place), generally have a small device size (as neither large inductors nor transformers are needed), and often have a relatively simple circuit architecture (usually comprising a voltage reference, a differential error amplifier, and a pass transistor).

A trend in the power supply industry has been to increase the switching frequency of SMPSs embodied (at least in part) in integrated circuits (ICs) in order to scale down the size of needed inductors and reduce the die area required for the SMPS. For example, the trend has been to move from a switching frequency of about 100 kHz to about 1 MHz. However, high switching frequencies lead to high frequency output ripple voltage, which must be filtered out when powering noise-sensitive circuitry. Accordingly, an LDO regulator circuit 106 must have a very high PSRR to adequately suppress ripples caused by high switching frequencies.

One way of achieving a high PSRR (and thus low noise) in an LDO regulator is to couple two or more LDO stages in a series cascade. Each LDO stage provides moderate isolation from the input power supplied by an SMPS. For example, FIG. 2 is a schematic diagram 200 of a prior art 2-Stage LDO regulator circuit 201 connected to a capacitive and resistive output load 202.

In Stage 1, a differential error amplifier 204 has a first input coupled to a stable reference voltage $V_{REF1}$ (e.g., a bandgap reference) and an output connected to the gate of a field effect transistor (FET) M1, which may be, for example, a MOSFET. The Stage 1 error amplifier 204 is powered by a voltage source to be regulated, $V_{IN}$, and is connected to circuit ground. The FET M1 is connected between $V_{IN}$ and a voltage divider 206 comprising resistors R1 and R2 connected in series between the FET M1 and circuit ground. A node X between resistors R1 and R2 is connected to a second input of the error amplifier 204. A decoupling capacitor $C_{LDO1}$ filters noise from the output of Stage 1 of the LDO regulator circuit 201 and provides a charge reservoir for smoothing the output.

Similarly, in Stage 2, a differential error amplifier 208 has a first input connected to a stable reference voltage $V_{REF2}$ (which may be the same as $V_{REF1}$) and an output connected to the gate of a field effect transistor (FET) M2, which may be, for example, a MOSFET. The Stage 2 error amplifier 208 is powered by the output of Stage 1 of the LDO regulator circuit 201, and provides a regulated voltage output $V_{OUT}$ to the capacitive and resistive output load 202, which in turn is connected to circuit ground. In this example, the capacitive and resistive output load 202 comprises a capacitance $C_{LOAD}$ connected in parallel with a resistance $R_{LOAD}$.

In the illustrated example, $V_{OUT}$ is directly connected to the second input of the Stage 2 error amplifier 208 (i.e., a voltage divider is omitted). However, in some embodiments, $V_{OUT}$ may be connected to the second input of the Stage 2 error amplifier 208 through a voltage divider, as in Stage 1.

In operation, the input to the Stage 1 error amplifier 204 from node X comprises a fraction of the output from the FET M1 (determined by the resistor ratio of R1 and R2), which is compared against the reference voltage $V_{REF1}$. If the output voltage of FET M1 rises too high relative to the reference voltage $V_{REF1}$, the output of the error amplifier 204 changes the drive bias to the FET M1 so as to maintain a constant output voltage. Similarly, the input to the Stage 2 error amplifier 208 from $V_{OUT}$ is compared to the reference voltage $V_{REF2}$. If the output voltage of FET M2 rises too high relative to the reference voltage $V_{REF2}$, the output of the error amplifier 208 changes the drive bias to the FET M2 so as to maintain an essentially constant DC power output voltage $V_{OUT}$ for a load current $I_{LOAD}$.

It should be appreciated that the illustrated LDO stages may be more complex. For example, one or more stages may include a driver FET connected to the output of the error amplifier, where the driver FET (not shown) in turn controls the gate of a pass FET like FETs M1 and/or M2.

The overall PSRR of a multi-stage LDO regulator is the sum (in dB) of the PSRR of the individual LDO stages. Thus, for the 2-Stage LDO regulator 201 of FIG. 2, $PSRR_{total}(dB)=PSRR_{stage1}+PSRR_{stage2}$. By cascading LDO stages, each stage need not guarantee a high PSRR by itself, and accordingly its design trade-offs can be relaxed. For example, DC gain per stage can be lower than for a single LDO, which allows for an increase in bandwidth per stage, which is desirable for extending high PSRR to high frequencies (e.g., about 1 MHz).

LDO regulator circuits like the example shown in FIG. 2 present design challenges, particularly with respect to maintaining loop stability and good load regulation. The present invention provides circuits and methods that meet a number of these design challenges.

SUMMARY

The present invention encompasses circuits and methods for maintaining loop stability and good load regulation in LDO regulator circuits having a low loop gain. Embodiments of the present invention encompass LDO regulator circuits that include an offset error correction circuit that generates an opposing voltage $V_{OFFSET}$ as a function of load current $I_{LOAD}$ to substantially cancel out variations in $V_{OUT}$ that would otherwise occur due to load regulation limitations of the LDO regulator circuits.

Embodiments include a sense FET coupled to a low loop gain LDO regulator circuit so as to sense the current $I_{LOAD}$ flowing through the LDO regulator circuit (preferably with little or no effect on the overall operation of the low loop gain LDO regulator circuit) and generate an offset current $I_{OFFSET}$. In one embodiment, a modified error amplifier uses the offset current $I_{OFFSET}$ to imbalance the input current to a pair of transistors to create a voltage offset $V_{OFFSET}$ between the voltages, $V_{REF2}$ and $V_{OUT}$, applied to the transistor gate inputs. The polarity of the voltage offset $V_{OFFSET}$ is in the opposite direction from the uncorrected value of $V_{OUT}$ to reduce the variation in the final, post-correction $V_{OUT}$ due to load regulation limitations of the low loop gain LDO regulator circuit. Thus, $V_{OFFSET} = f(I_{OFFSET}) = f(I_{SENSE}) = f(I_{LOAD})$.

Benefits of embodiments of the Invention include improved LDO load regulation even when feedback loop gain is low (noting that the error correction circuitry described above can be used with high-gain LDO regulator circuits), the availability of both digital and analog implementations, high LDO accuracy and less variation of the output voltage $V_{OUT}$, and suitability for implementation in integrated circuits (ICs) for applications such as high precision power supplies.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4A is a diagram of an equivalent model for a conventional LDO.

FIG. 4B is a graph showing the degree of variation in $V_{OUT}$ relative to $I_{LOAD}$ for a conventional LDO regulator circuit having a low loop gain.

FIG. 4C is a graph showing the degree of variation in $V_{OUT}$ relative to $I_{LOAD}$ for a conventional LDO regulator circuit having a high loop gain.

FIG. 12 is a process flow chart showing a first method for maintaining loop stability and good load regulation in an LDO regulator circuit that includes an input for an unregulated voltage and an output for a regulated voltage $V_{OUT}$.

FIG. 13 is a process flow chart showing a first method for maintaining loop stability and good load regulation in an LDO regulator circuit that includes an input for an unregulated voltage and an output for a regulated voltage $V_{OUT}$.

Like reference numbers and designations in the various drawings indicate like elements.

DETAILED DESCRIPTION

The present invention encompasses circuits and methods for maintaining loop stability and good load regulation in LDO regulator circuits having a low loop gain.

Figure 3:
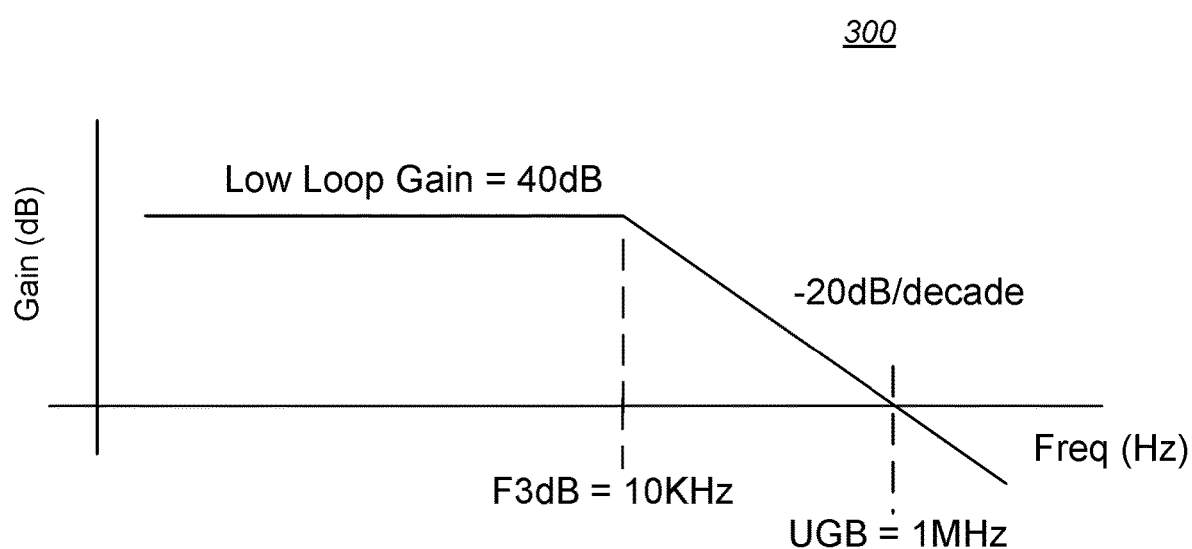
FIG. 3 is a graph of gain as a function of frequency for an example high-frequency LDO regulator circuit.

High frequency (e.g., around 1 MHz) low drop-out (LDO) regulator circuits having a high PSRR are generally designed to have feedback loops that have higher Unity Gain Bandwidths (UGB) around their highest frequency. For example, FIG. 3 is a graph 300 of gain as a function of frequency for an example high-frequency LDO regulator circuit. In the illustrated example, if the cutoff frequency [F3 dB pole=$1/(2*\pi*C_{LOAD}*R_{LOAD})$] is at about 10 KHz, then a low loop gain of 40 dB is required to have UGB at 1 MHz.

A design challenge for LDO regulator circuits is that low loop gains limit the ability of a conventional feedback loop to correct errors in the output due to load variations—that is, conventional LDO regulator circuits with low loop gains generally have low load regulation capability.

For example, FIG. 4A is a diagram 400 of an equivalent model for a conventional LDO. In the illustrated example, a voltage source $V_{REF2}/\beta$ is coupled in series with a load $R_{OUT}$. Load regulation for this equivalent model is defined as:

$$\text{Load Regulation} = \frac{\Delta V_{OUT}}{\Delta I_{LOAD}} = R_{OUT} = \frac{\text{ro\_pass2}}{1 + A\beta} \quad \text{EQ. 1}$$

In Equation 1, "ro_pass2" is the small-signal resistance between the drain and the source of a MOSFET due to a channel-length modulation effect when the transistor is in saturation, and $A\beta$ is the LDO Stage 2 loop gain, where "A" is the feedforward gain of the feedback loop, and $\beta$ is the feedback ratio and is less than one. Further, $V_{OUT}=(V_{REF2}/\beta)-I_{LOAD}*R_{OUT}$.

FIG. 4B is a graph 420 showing the degree of variation in $V_{OUT}$ relative to $I_{LOAD}$ for a conventional LDO regulator circuit having a low loop gain. FIG. 4C is a graph 440 having a high loop gain. In both graphs, $V_{OUT}$ is equal to $V_{REF2}/\beta$ in a no-load condition. However, in a full-load condition, $V_{OUT}$ is much less than $V_{REF2}/\beta$ for the low loop gain LDO regulator circuit compared to $V_{OUT}$ for the high loop gain LDO regulator circuit. Accordingly, the amount of variation in $V_{OUT}$ in the full-load condition relative to the no-load condition is much greater for the low loop gain LDO regulator circuit than for the high loop gain LDO regulator circuit. However, achieving the results shown in FIG. 4C is not known to be possible for conventional low loop gain LDO regulator circuits, which behave as shown in FIG. 4B.

One goal of the present invention is to achieve good load regulation capability for LDO regulator circuits having low loop gains. Embodiments of the present invention encompass LDO regulator circuits that include an offset error correction circuit that generates an opposing voltage $V_{OFFSET}$ as a function of load current $I_{LOAD}$ to substantially cancel out variations in $V_{OUT}$ that would otherwise occur due to load regulation limitations of the LDO regulator circuits.

Figure 5A:
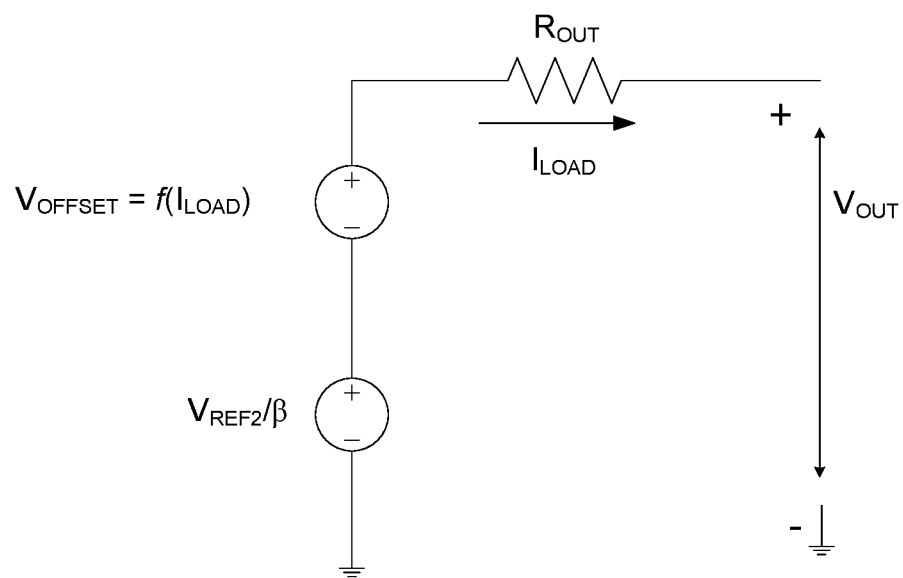
FIG. 5A is a diagram of an equivalent model for a low loop gain LDO in accordance with the present invention.

For example, FIG. 5A is a diagram 500 of an equivalent model for a low loop gain LDO in accordance with the present invention. In the illustrated example, a voltage source $V_{REF2}/\beta$ and an offset voltage source $V_{OFFSET}$ are coupled in series with a the LDO output impedance $R_{OUT}$. The offset voltage source $V_{OFFSET}$ should have an opposite polarity relative to the voltage drop across $R_{OUT}$ (i.e., $I_{LOAD}*R_{OUT}$) in order to correct the output error due to load regulation. Accordingly, for this model, $V_{OUT}=(V_{REF2}/\beta)+V_{OFFSET}-(I_{LOAD}*R_{OUT})$.

Figure 5B:
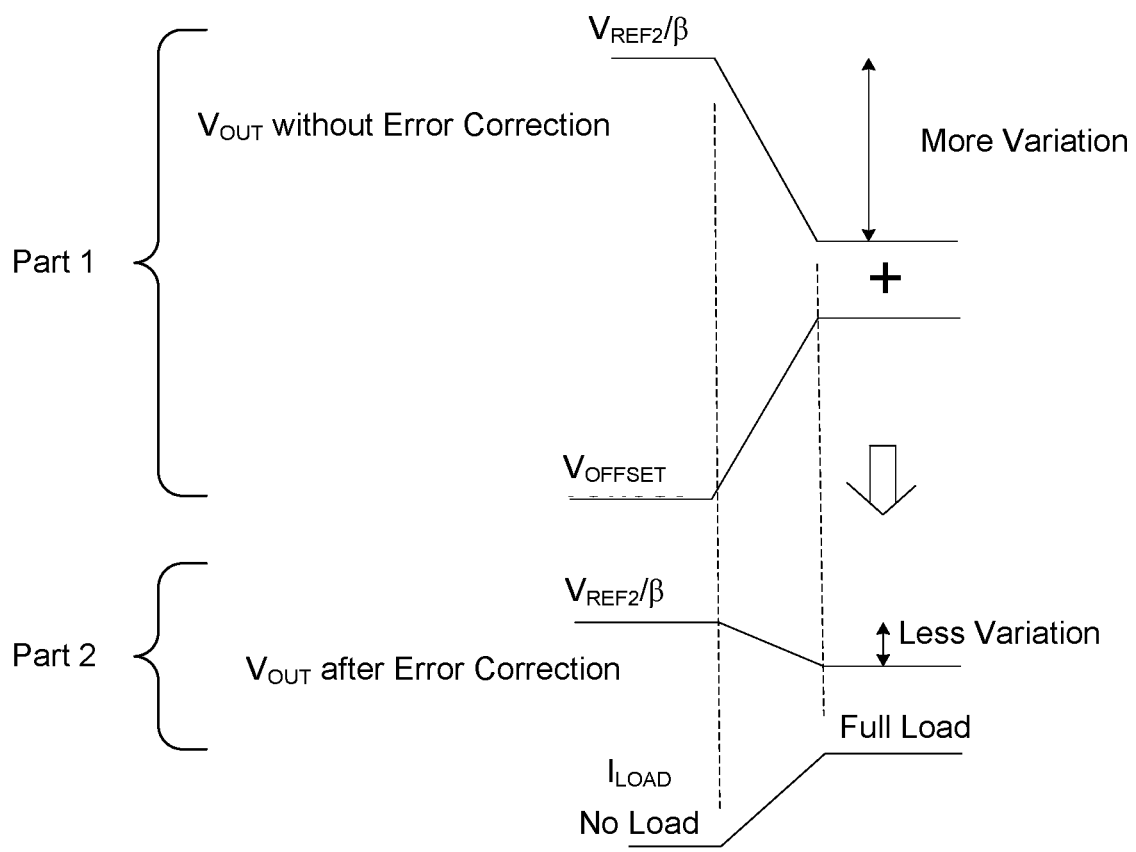
FIG. 5B is a two-part graph showing the degree of variation in $V_{OUT}$ relative to $I_{LOAD}$ for a low loop gain LDO regulator circuit with and without error correction in accordance with the present invention.

FIG. 5B is a two-part graph 520 showing the degree of variation in $V_{OUT}$ relative to $I_{LOAD}$ for a low loop gain LDO regulator circuit with and without error correction in accordance with the present invention. Part 1 of the graph illustrates $V_{OUT}$ as a function of load current UAL) without error correction, showing essentially the same degree of variation of $V_{OUT}$ between no-load and full-load conditions as is shown in FIG. 4B. Part 1 of the graph also shows the opposing correction provided by $V_{OFFSET}$ as a function of load current $I_{LOAD}$ in accordance with the present invention. Part 2 of the graph illustrates $V_{OUT}$ as a function of load current $I_{LOAD}$ after error correction (that is, after $V_{OFFSET}$ is added to the uncorrected $V_{OUT}$), showing essentially the same relatively small degree of variation of $V_{OUT}$ between no-load and full-load conditions as is shown in FIG. 4C, but in a low loop gain LDO regulator circuit.

Figure 1:
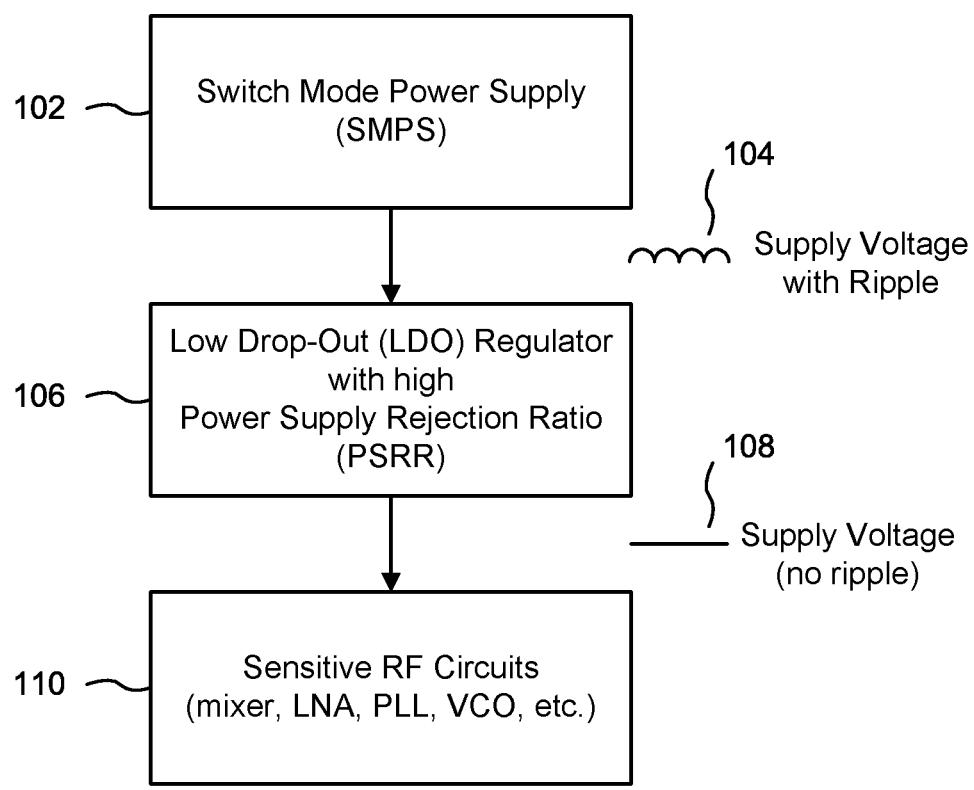
FIG. 1 is a block diagram of a generalized prior art electronic circuit powered by an SMPS.
Figure 2:
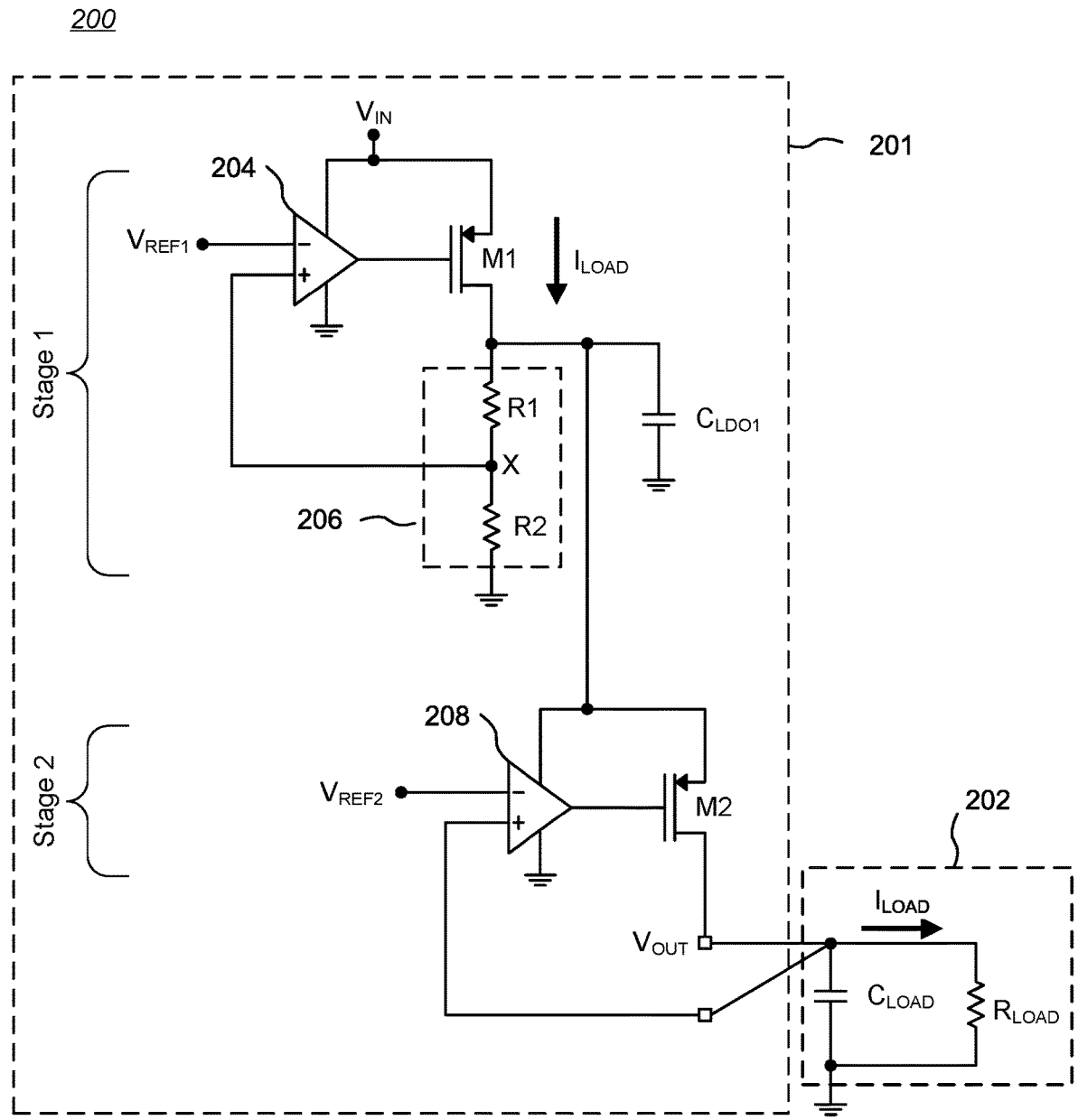
FIG. 2 is a schematic diagram of a prior art 2-Stage LDO regulator circuit connected to a capacitive and resistive output load.
Figure 6:
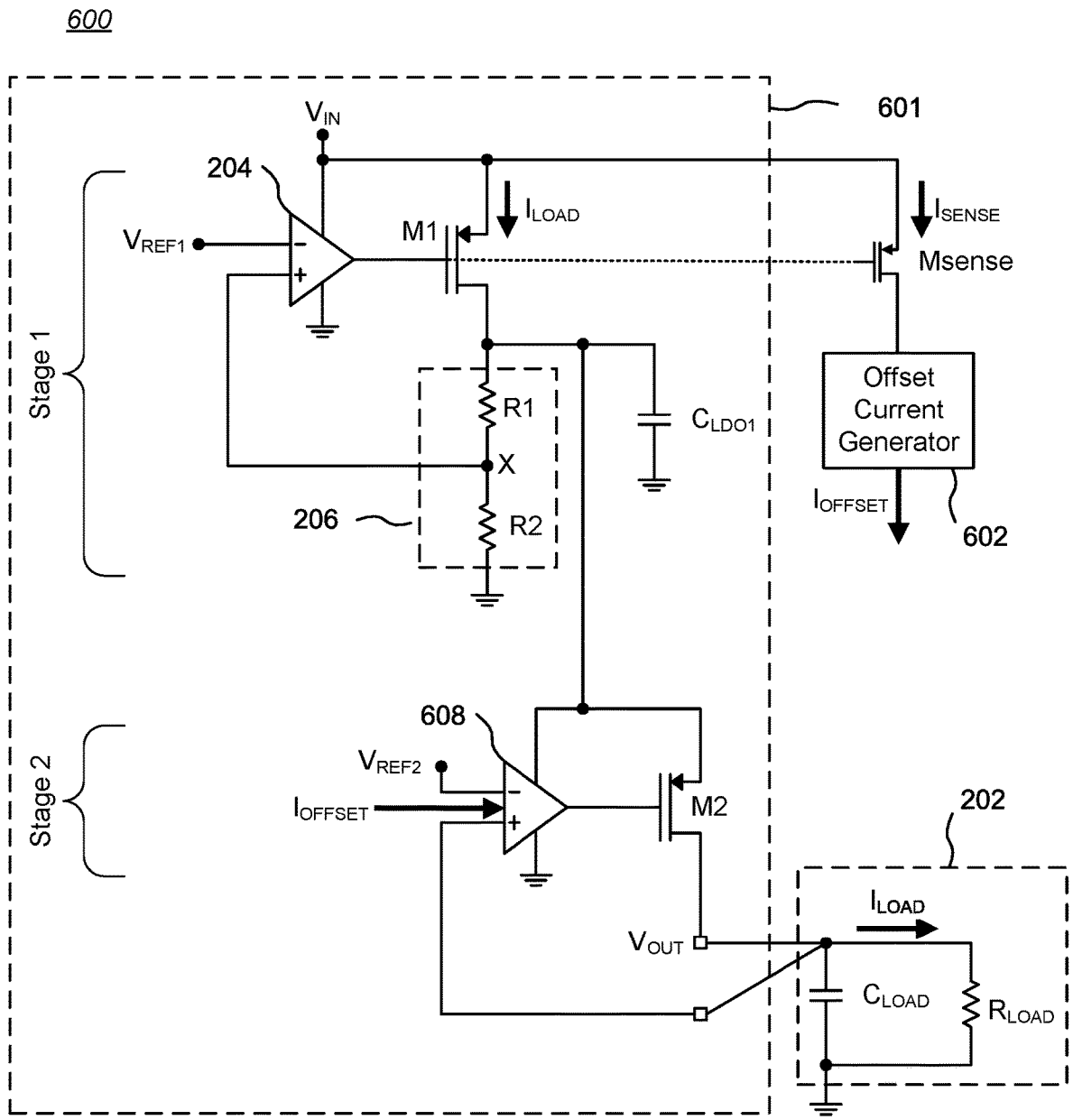
FIG. 6 is a block diagram of one embodiment a low loop gain LDO regulator circuit coupled to a capacitive and resistive output load and including an error correction circuit in accordance with the present invention.

A number of circuits can be used to monitor LOAD and generate $V_{OFFSET}$ in a low loop gain LDO regulator circuit. For example, FIG. 6 is a block diagram 600 of one embodiment a low loop gain LDO regulator circuit 601 coupled to a capacitive and resistive output load 202 and including an error correction circuit in accordance with the present invention. In general, the low loop gain LDO regulator circuit 601 is similar to the LDO regulator circuit 201 of FIG. 2, but with the changes noted below.

In the illustrated example, the error correction circuit includes a sense FET Msense coupled in parallel with the Stage 1 FET M1. The sense FET Msense may be, for example, a MOSFET, and typically would be quite small compared to FET M1; for example, 1/1000 of the size and the current characteristic of the FET M1. Accordingly, the presence of the sense FET Msense has little or no effect on the overall operation of the low loop gain LDO regulator circuit 601. In the illustrated example, the gate of the sense FET Msense is controlled by the Stage 1 error amplifier 204. A fractional current $I_{SENSE}$ proportional to the load current $I_{LOAD}$ passing through the Stage 1 FET M1 (more generally, through the main pass transistor if a more complex Stage 1 circuit is used) passes through the parallel FET Msense to an Offset Current Generator 602.

The Offset Current Generator 602, another part of the error correction circuit, generates an offset current $I_{OFFSET}$ from $I_{SENSE}$. As described in greater detail below, the Offset Current Generator 602 may be implemented as a digital circuit and/or an analog circuit. The offset current $I_{OFFSET}$ is coupled to another part of the error correction circuit, a modified error amplifier 608 within Stage 2 of the low loop gain LDO regulator circuit 601.

In one embodiment, the modified error amplifier 608 uses the offset current $I_{OFFSET}$ to imbalance the input current to a pair of transistors to create a voltage offset $V_{OFFSET}$ between the voltages, $V_{REF2}$ and $V_{OUT}$, applied to the transistor gate inputs. The polarity of the voltage offset $V_{OFFSET}$ is in the opposite direction from the uncorrected value of $V_{OUT}$ to reduce the variation in the final, post-correction $V_{OUT}$ due to load regulation limitations of the low loop gain LDO regulator circuit 601. Thus, $V_{OFFSET}=f(I_{OFFSET})=f(I_{SENSE})=f(I_{LOAD})$.

Figure 7:
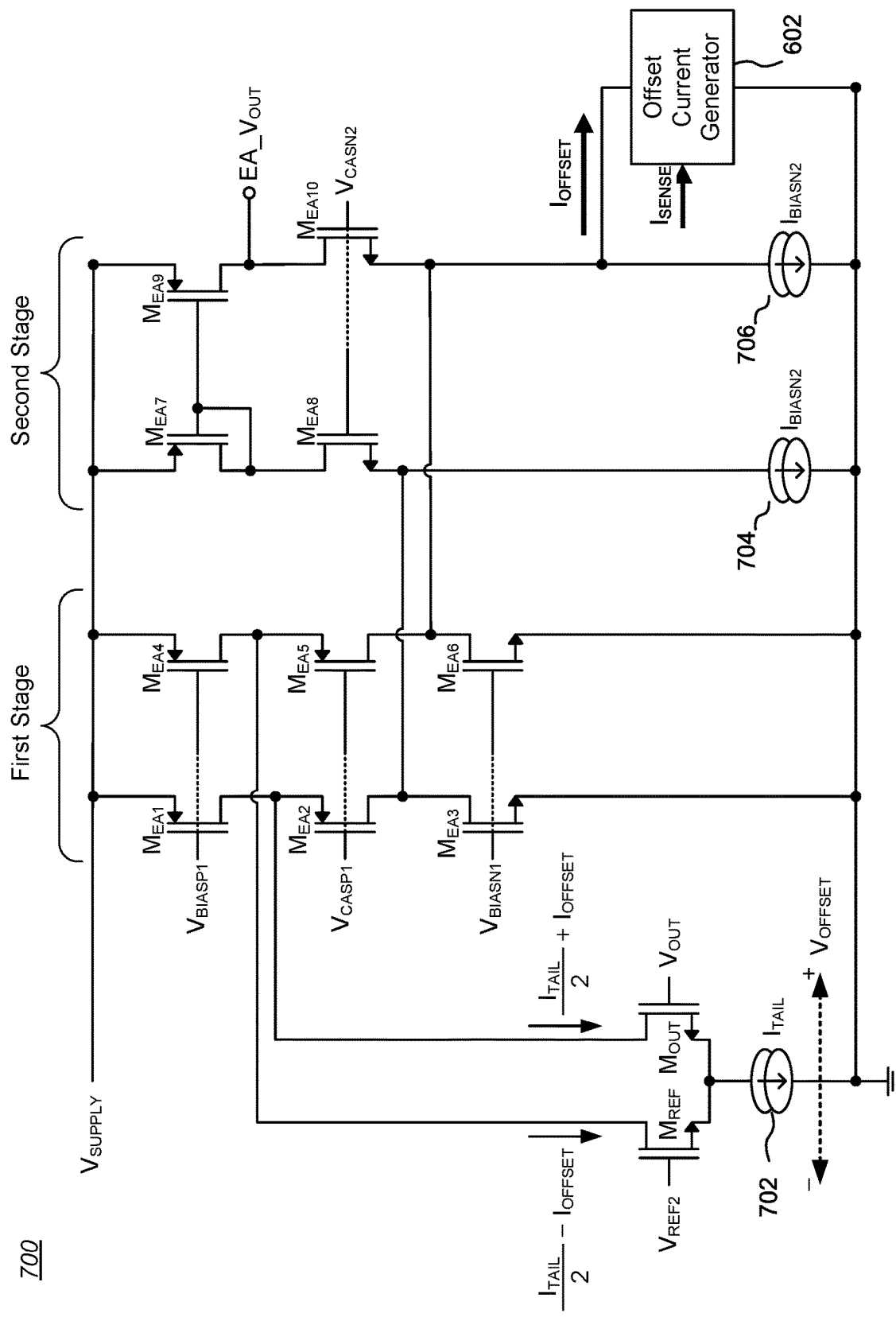
FIG. 7 is a schematic diagram of one embodiment of a modified error amplifier coupled to an offset current generator that generates an offset current $I_{OFFSET}$ as a function of $I_{SENSE}$.

FIG. 7 is a schematic diagram 700 of one embodiment of a modified error amplifier 608 coupled to an offset current generator 602 that generates an offset current $I_{OFFSET}$ as a function of $I_{SENSE}$. Inputs $V_{REF2}$ and $V_{OUT}$ (fed back from the ultimate output of the LDO regulator circuit) are applied to the gates of respective differential FETs $M_{REF}$ and $M_{OUT}$, both coupled to a first current source 702. The combined current through the differential FETs $M_{REF}$ and $M_{OUT}$ is $I_{TAIL}$. The supply voltage $V_{SUPPLY}$ to the modified error amplifier 608 is the output of Stage 1 of the low loop gain LDO regulator circuit 601. The output of the modified error amplifier 608 is a voltage, $EA\_V_{OUT}$, that is applied to the gate of the Stage 2 FET M2 (more generally, through the main pass transistor if a more complex Stage 2 circuit is used).

The modified error amplifier 608 is configured as a two-stage differential amplifier, each stage comprising two legs. A first leg of the first stage comprises FETs $M_{EA1}$ and $M_{EA2}$, with FET $M_{EA3}$ functioning as a current source. FETs $M_{OUT}$ and $M_{EA2}$ are configured in a folded cascode arrangement, with FET $M_{EA1}$ providing bias current. A second leg of the first stage comprises FETs $M_{EA4}$ and $M_{EA5}$, with FET $M_{EA6}$ functioning as a current source. FETs $M_{REF}$ and $M_{EA5}$ are also configured in a folded cascode arrangement, with FET $M_{EA4}$ providing bias current.

A first leg of the second stage comprises FETs MEAT and $M_{EA8}$ coupled to a second current source 704, and a second leg of the second stage comprises FETs $M_{EA9}$ and $M_{EA10}$ coupled to a third current source 706. The first and second legs of the second stage are configured as a current mirror having inputs coupled to respective nodes after the cascode pairs of the first and second legs of the first stage. The differential FETs $M_{REF}$ and $M_{OUT}$ are coupled to respective nodes between the cascode pairs of the first and second legs of the first stage.

An essentially constant current through FET MEAL is shared between FET $M_{OUT}$ and the path through FETs $M_{EA2}$ and $M_{EA3}$. Similarly, an essentially constant current through FET $M_{EA4}$ is shared between FET $M_{REF}$ and the path through FETs $M_{EA5}$ and $M_{EA6}$. The output of the $M_{EA1}/M_{EA2}$ cascode pair influences the current through the first leg of the second stage, while the output of the $M_{EA4}/M_{EA5}$ cascode pair influences the current through the second leg of the second stage.

In steady-state operation (i.e., $V_{REF2}=V_{OUT}$) and ignoring any contribution by the offset current generator 602 for the moment, the currents through the differential FETs $M_{REF}$ and $M_{OUT}$ are equal. However, if (for example) $V_{OUT}$ becomes less than $V_{REF2}$, then the current through FET $M_{OUT}$ will be reduced by an amount A, resulting in an offsetting increase of current through FET $M_{EA2}$ in the first leg of the first stage by A. The reduced current through FET $M_{OUT}$ by Δ will result in an offsetting increase of current through FET $M_{REF}$ by A. As a result, the current through FET $M_{EA5}$ in the second leg of the first stage will decrease by A. The imbalance of currents in the first stage will propagate to the second stage, resulting in a decrease in EA_$V_{OUT}$.

Taking into account the offset current generator 602, the basic idea is to imbalance currents in any differential path so that an offset is propagated to the pair of inputs $V_{REF2}$ and $V_{OUT}$, thus altering the output voltage EA_$V_{OUT}$ to a corrected value. The imbalance of currents through the input pair of transistors $M_{REF}$ and $M_{OUT}$ results in those transistors having different $V_{GS}$ values, which creates an offset $V_{OFFSET}=V_{GS\_MOUT}-V_{GS\_MREF}=f(I_{OFFSET})$. In the illustrated example, FETs $M_{EA1}$-$M_{EA3}$, when suitably biased, provide a current through the FET $M_{OUT}$ that is equal to one-half of $I_{TAIL}$, plus $I_{OFFSET}$ from the current generator 602. FETs $M_{EA4}$-$M_{EA6}$, when suitably biased, provide a current through the FET $M_{REF}$ that is equal to one-half of $I_{TAIL}$, minus $I_{OFFSET}$ from the current generator 602. Note that bias circuitry is not shown for to avoid clutter.

In greater detail, the offset current generator 602 is coupled to the respective second legs of the first and second stages as shown, and accordingly can influence the current flow through those legs. When the offset current generator 602 generates $I_{OFFSET}$, that amount of current is subtracted from the current passing through FET $M_{REF}$, and accordingly, that amount of current is added to the current passing through the FET $M_{OUT}$, so that while the total current through differential FETs $M_{REF}$ and $M_{OUT}$ remains equal to $I_{TAIL}$, an imbalance of currents exists through the input pair of transistors $M_{REF}$ and $M_{OUT}$.

Of note, the point of connection of the current generator 602 is preferably chosen to be a relatively low impedance point so that loading by the circuitry generating $I_{OFFSET}$ does not affect pole locations within the low loop gain LDO regulator circuit 601 and the loop remains stable.

Figure 8A:
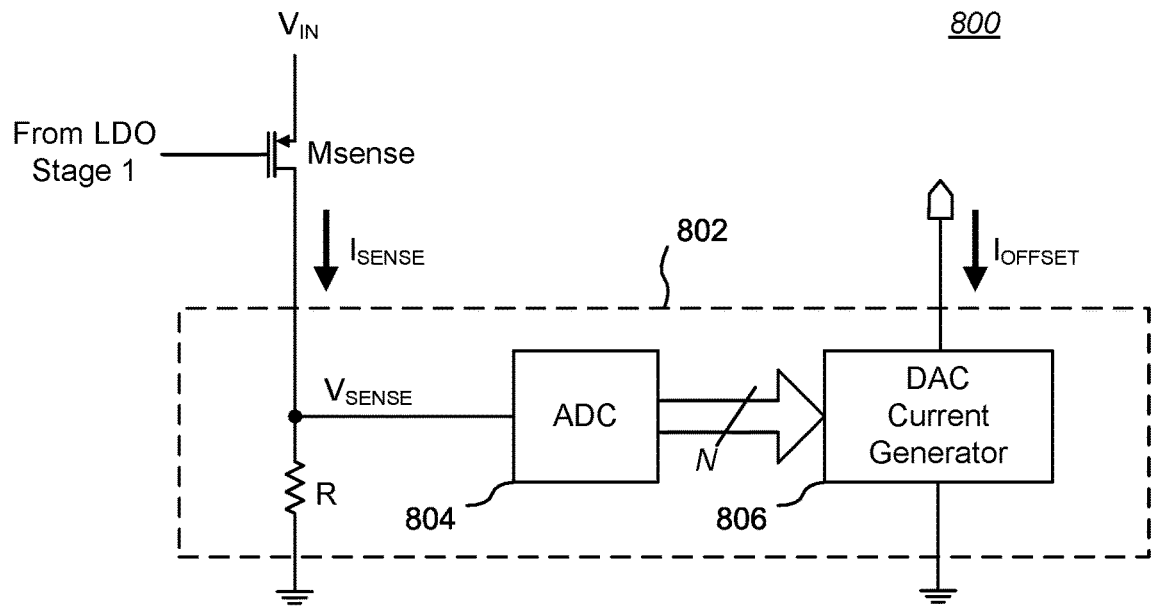
FIG. 8A is a schematic diagram showing an embodiment of a current sensing circuit and a digital offset current generator.

FIG. 8A is a schematic diagram 800 showing an embodiment of a current sensing circuit and a digital offset current generator 802. The digital offset current generator 802 may be used as the current generator 602 in FIG. 6. The current $I_{SENSE}$ through the FET $M_{SENSE}$ (see FIG. 6) is coupled to a current transform circuit, comprising resistor R in this example, to generate a voltage $V_{SENSE}$, which is applied to an analog-to-digital converter (ADC) 804. The ADC 804 outputs a digital value comprising N bits that correspond to the magnitude of the input analog voltage $V_{SENSE}$. For high frequency LDO regulator circuits, the ADC 804 should be fast, such as a flash ADC. As is known in the art, a flash ADC uses a linear voltage ladder with a comparator at each "rung" of the ladder to compare an input voltage to successive reference voltages to provide direct conversion of the magnitude of an analog voltage to a corresponding digital value.

Figure 8B:
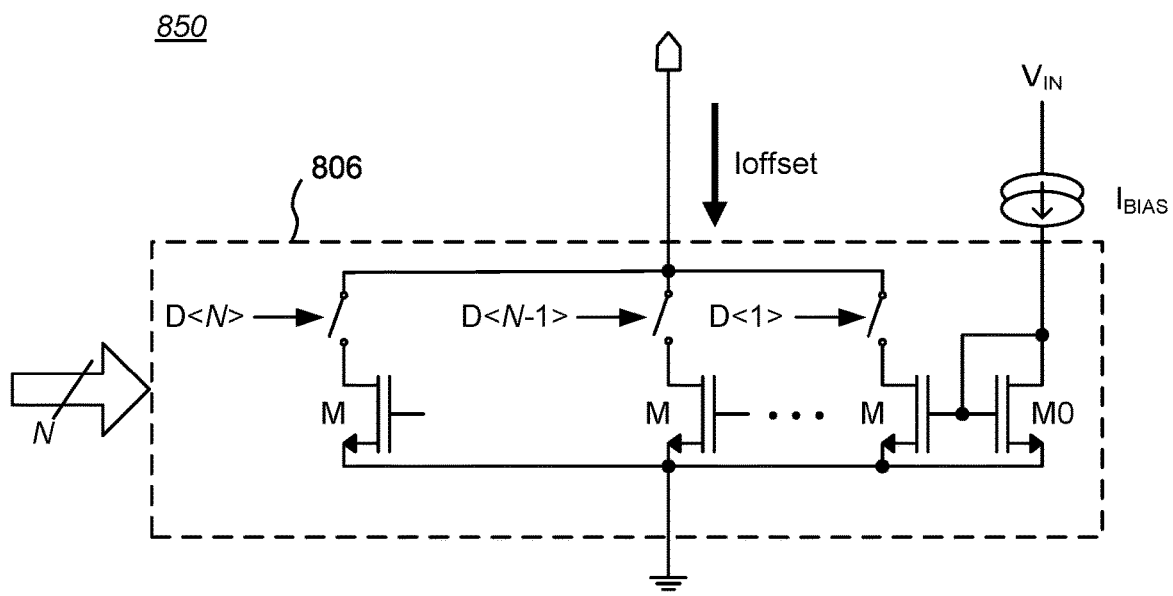
FIG. 8B is a schematic diagram showing an embodiment of a DAC current generator.

In the illustrated example, the N bits from the ADC 804 may be applied to a digital-to-analog converter (DAC) current generator 806 to generate $I_{OFFSET}$ as a function of $I_{SENSE}$. FIG. 8B is a schematic diagram 850 showing an embodiment of a DAC current generator 806. A set of parallel switch legs each comprise a FET M in series with a switch D<n>, where n is from 1 to N. The gates of each FET M are biased by a diode-connected FET M0 coupled to a voltage source $V_{IN}$. In operation, the amount of current $I_{OFFSET}$ that can pass through the DAC current generator 806 is determined by the number of switches D<n> that are closed and the bias level for the FETs M. Thus, $I_{OFFSET}$ is a function of $I_{SENSE}$, which is a function of $I_{LOAD}$.

In alternative embodiments, $V_{SENSE}$ may be used directly within the modified error amplifier 608 to imbalance currents in any differential path so that an offset is propagated to the pair of inputs $V_{REF2}$ and $V_{OUT}$, thus altering the output voltage EA_$V_{OUT}$ to a corrected value. For example $V_{SENSE}$ may be used to bias the differential FETs $M_{REF}$ and $M_{OUT}$ so as to create a difference in the $V_{GS}$ of those FETs and thereby alter the flow of current through them to correct the load-induced error in $V_{OUT}$ that would otherwise occur.

Figure 9:
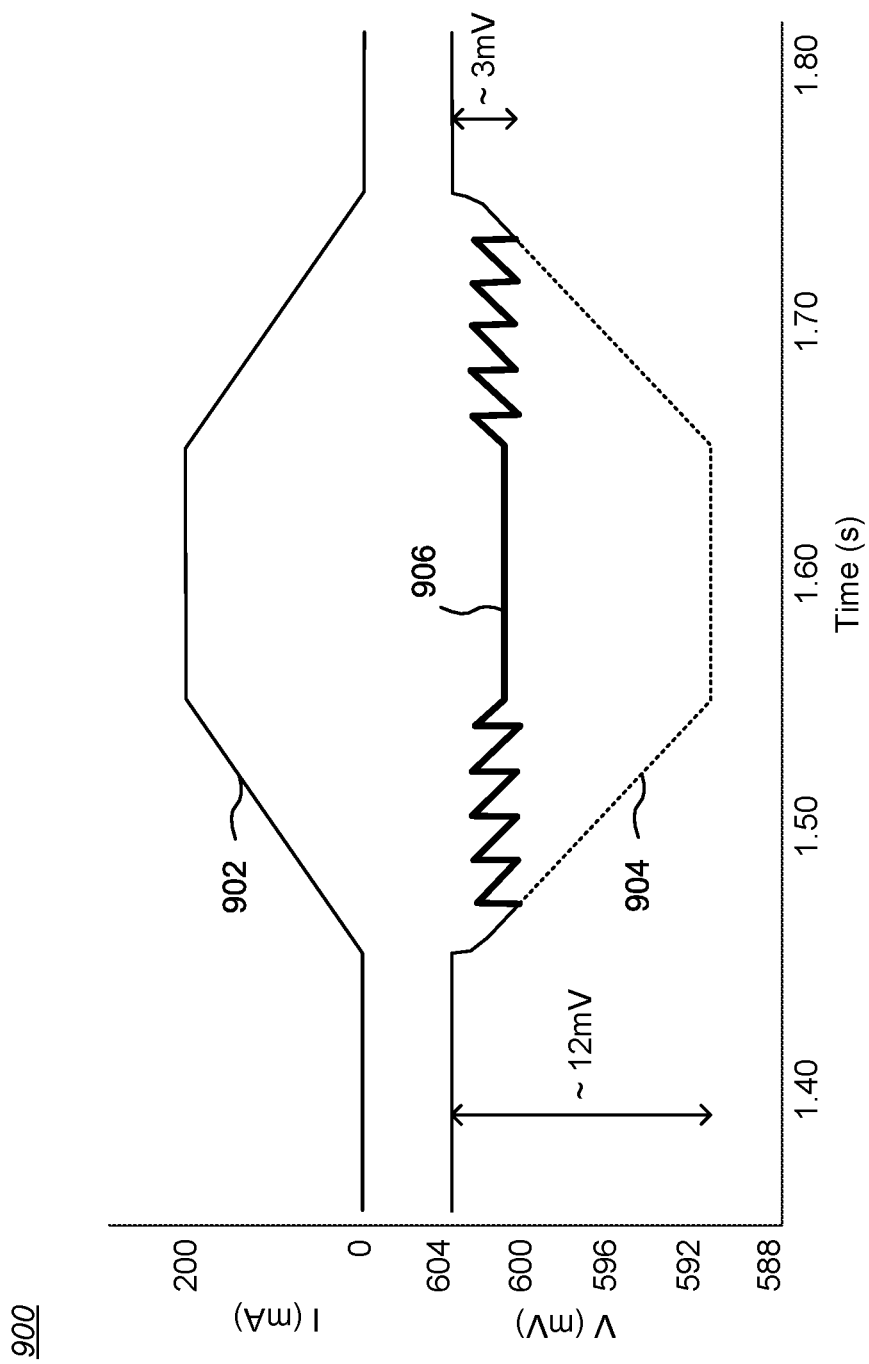
FIG. 9 is a graph showing load current and output voltages (with and without error correction) as a function of time for one modeled instance of the low loop gain LDO regulator circuit of FIG. 6, using a digital offset current generator.

FIG. 9 is a graph 900 showing load current and output voltages (with and without error correction) as a function of time for one modeled instance of the low loop gain LDO regulator circuit 601 of FIG. 6, using a digital offset current generator 802. Graph line 902 shows variations in the load current $I_{LOAD}$ from 0 A to about 200 mA and back, over a short period of time. Dotted graph line 904 shows what the corresponding value of $V_{OUT}$ would be without error correction by the digital offset current generator 802. Bold graph line 906 shows what the corresponding value of $V_{OUT}$ would be with error correction by the digital offset current generator 802. In this particular example, the error in $V_{OUT}$ was reduced from about 12 mV (about 2% of $V_{OUT}$) to about 3 mV (about 0.5% of $V_{OUT}$).

Figure 10:
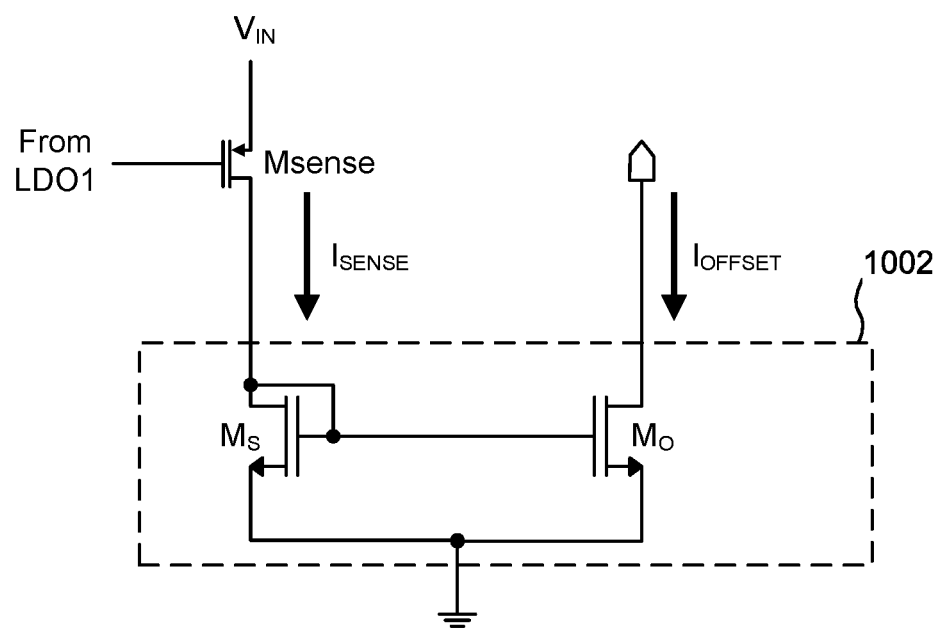
FIG. 10 is a schematic diagram showing an embodiment of a current sensing circuit and an analog offset current generator.

FIG. 10 is a schematic diagram 1000 showing an embodiment of a current sensing circuit and an analog offset current generator 1002. The analog offset current generator 1002 may be used as the current generator 602 in FIG. 6, and has the advantage that $V_{OUT}$ variation as a function of load current $I_{LOAD}$ is continuous and smooth. The current $I_{SENSE}$ through the FET $M_{SENSE}$ (see FIG. 6) is coupled to a current mirror comprising commonly-biased FET $M_S$ and $M_O$. The current $I_{SENSE}$ is mirrored and amplified through the larger FET $M_O$ as the offset current $I_{OFFSET}$. Thus, $I_{OFFSET}$ is a function of $I_{SENSE}$, which is a function of $I_{LOAD}$.

Figure 11:
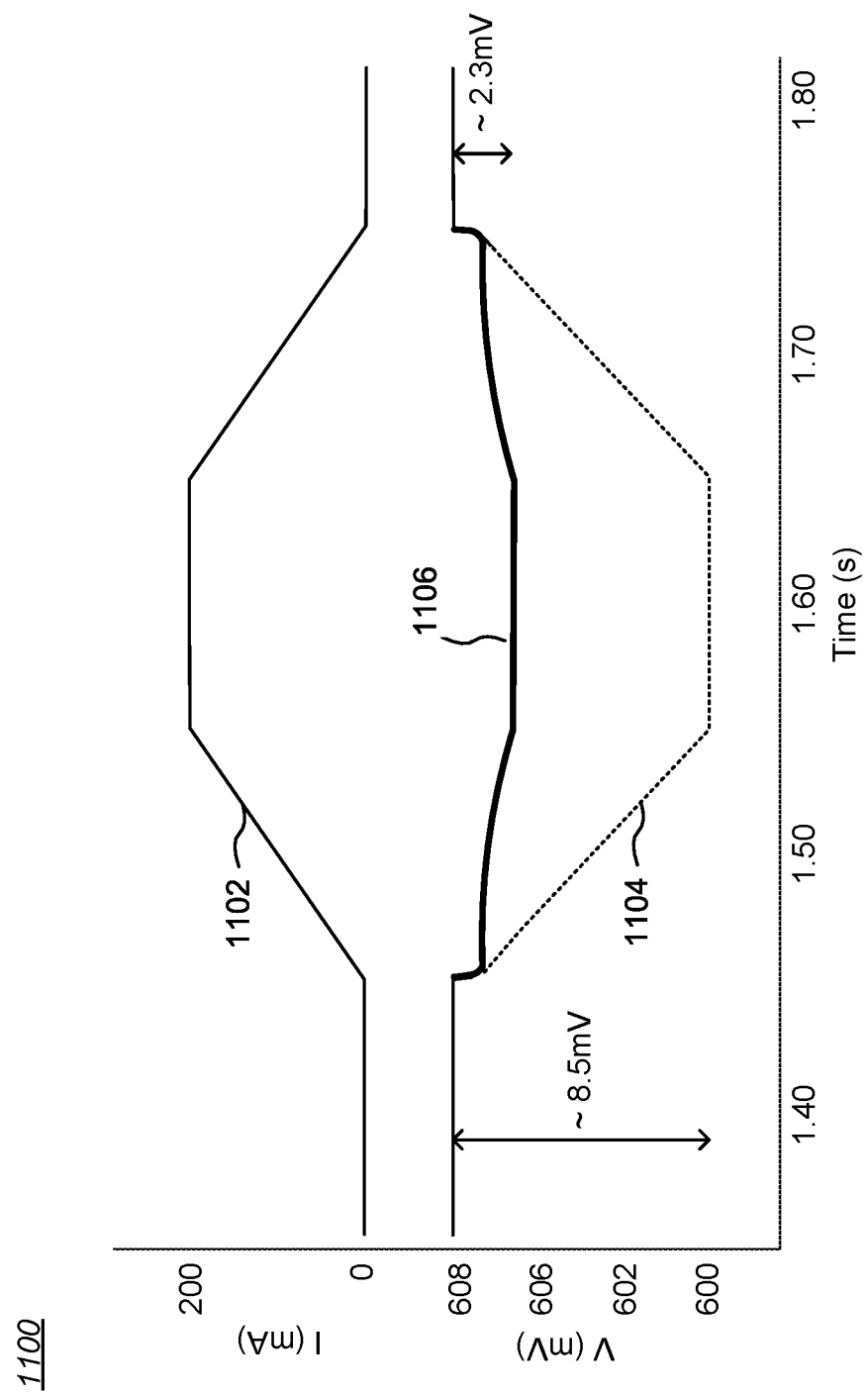
FIG. 11 is a graph showing load current and output voltages (with and without error correction) as a function of time for one modeled instance of the low loop gain LDO regulator circuit of FIG. 6, using an analog offset current generator.

FIG. 11 is a graph 1100 showing load current and output voltages (with and without error correction) as a function of time for one modeled instance of the low loop gain LDO regulator circuit 601 of FIG. 6, using an analog offset current generator 1002. Graph line 1102 shows variations in the load current $I_{LOAD}$ from 0 A to about 200 mA and back, over a short period of time. Dotted graph line 1104 shows what the corresponding value of $V_{OUT}$ would be without error correction by the analog offset current generator 1002. Bold graph line 1106 shows what the corresponding value of $V_{OUT}$ would be with error correction by the analog offset current generator 1002. In this particular example, the error in $V_{OUT}$ was reduced from about 8.5 mV (about 1.4% of $V_{OUT}$) to about 2.3 mV (about 0.4% of $V_{OUT}$). As should be clear from the graph 1100, the load regulation of $V_{OUT}$ when error corrected is smooth, which may have advantages in some applications where noise spikes may be problematic.

Benefits of embodiments of the invention include improved LDO load regulation even when feedback loop gain is low (noting that the error correction circuitry described above can be used with high-gain LDO regulator circuits), the available of both digital and analog implementations, high LDO accuracy and less variation of the output voltage $V_{OUT}$, and suitability for implementation in integrated circuits (ICs) for applications such as high precision power supplies.

Methods

Another aspect of the invention includes methods for maintaining loop stability and good load regulation in a low-dropout (LDO) regulator circuit. For example, FIG. 12 is a process flow chart 1200 showing a first method for maintaining loop stability and good load regulation in an LDO regulator circuit that includes an input for a voltage (generally an unregulated voltage) and an output for a regulated voltage $V_{OUT}$. The method includes generating an offset correction signal as a function of a load current $I_{LOAD}$ through the LDO regulator circuit and applying the offset correction signal to the LDO regulator circuit to substantially cancel out variations in $V_{OUT}$ resulting from a low feedback loop gain of the LDO regulator circuit (Block 1202).

As another example, FIG. 13 is a process flow chart 1300 showing a first method for maintaining loop stability and good load regulation in an LDO regulator circuit that includes an input for a voltage (generally an unregulated voltage) and an output for a regulated voltage $V_{OUT}$. The method includes: generating an offset current $I_{OFFSET}$ as a function of a load current $I_{LOAD}$ through the LDO regulator circuit (Block 1302); and applying the offset current $I_{OFFSET}$ to an error amplifier having a first differential input and a second differential input controlling the generation of the regulated voltage $V_{OUT}$, such that the first differential input passes a current reduced by the offset current $I_{OFFSET}$ and the second differential input passes a current increased by the offset current $I_{OFFSET}$, thereby substantially cancelling out variations in $V_{OUT}$ that would otherwise occur due to load regulation limitations of the LDO regulator circuit (Block 1304).

Additional aspects of the above method may include one or more of the following: wherein the LDO regulator circuit is a low loop gain LDO regulator circuit; wherein the LDO regulator circuit further includes an error amplifier having a first differential input and a second differential input controlling the generation of the regulated voltage $V_{OUT}$, further including applying the offset current $I_{OFFSET}$ to the first differential input so that the first differential input passes a current reduced by the offset current $I_{OFFSET}$, and applying the offset current $I_{OFFSET}$ to the second differential input so that the second differential input passes a current increased by the offset current $I_{OFFSET}$; wherein generating the offset current $I_{OFFSET}$ includes configuring a sense field effect transistor (FET) to sense the load current $I_{LOAD}$ through the LDO regulator circuit and generate a sense current $I_{SENSE}$ as a function of the load current $I_{LOAD}$, and configuring an offset current generator, coupled to the sense FET, to generate the offset current $I_{OFFSET}$ as a function of the sense current $I_{SENSE}$; wherein the offset current generator includes a current transform circuit coupled to the sense FET and configured to convert the sense current $I_{SENSE}$ to a sense voltage $V_{SENSE}$, an analog-to-digital converter coupled to the current transform circuit and configured to convert a magnitude of the sense voltage $V_{SENSE}$ to a digital value comprising N bits, and a digital-to-analog converter current generator coupled to the analog-to-digital converter and configured to convert the digital value comprising N bits to the offset current $I_{OFFSET}$; and/or wherein the offset current generator includes a current mirror circuit coupled to the sense FET and configured to amplify the sense current $I_{SENSE}$ to the offset current $I_{OFFSET}$.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An offset error correction circuit configured to be coupled to a low-dropout (LDO) regulator circuit that includes a feedback loop, an input configured to receive an unregulated voltage from a voltage source, and an output for a regulated voltage $V_{OUT}$, the offset error correction circuit configured to generate an offset correction signal as a function of a load current $I_{LOAD}$ through the coupled LDO regulator circuit, the offset correction signal being provided to the coupled LDO regulator circuit so as to adjust the open-loop gain of the coupled LDO regulator circuit to substantially offset variations in the regulated voltage $V_{OUT}$.

2. A low-dropout (LDO) regulator circuit including an input configured to receive an unregulated voltage from a voltage source, an output for a regulated voltage $V_{OUT}$, and an offset error correction circuit that generates an offset current $I_{OFFSET}$ as a function of a load current $I_{LOAD}$ through the LDO regulator circuit, wherein the offset current $I_{OFFSET}$ is provided to the LDO regulator circuit which produces a correction signal $V_{OFFSET}$ that substantially offsets variations in the regulated voltage $V_{OUT}$ due to closed-loop operation of the LDO regulator circuit.

3. The invention of claim 2, wherein the variations in the regulated voltage $V_{OUT}$ result from a low loop gain of the LDO regulator circuit.

4. The invention of claim 2, wherein the LDO regulator circuit includes a first stage that includes the input for the unregulated voltage and a second stage that outputs the regulated voltage $V_{OUT}$, wherein the offset error correction circuit is coupled to sense the load current $I_{LOAD}$ through the input of the first stage.

5. The invention of claim 2, wherein the LDO regulator circuit includes a first stage that includes the input for the voltage and a second stage that outputs the regulated voltage $V_{OUT}$, wherein the offset current $I_{OFFSET}$ generated by the offset error correction circuit is applied to the second stage to generate the correction signal $V_{OFFSET}$.

6. The invention of claim 2, wherein the LDO regulator circuit includes a first stage that includes the input for the unregulated voltage and a second stage that includes a differential error amplifier circuit and outputs the regulated voltage $V_{OUT}$, wherein the offset current $I_{OFFSET}$ generated by the offset error correction circuit is applied to the second stage and summed with currents flowing through the differential error amplifier circuit so as to substantially offset variations in the regulated voltage $V_{OUT}$ due to closed-loop operation of the LDO regulator circuit.

7. The invention of claim 2, wherein the LDO regulator circuit includes a first loop that includes the input for the unregulated voltage and a second loop that outputs the regulated voltage $V_{OUT}$, wherein the offset error correction circuit is coupled to sense the load current $I_{LOAD}$ through the input of the first loop, and wherein the offset current $I_{OFFSET}$ generated by the offset error correction circuit is applied to the second loop to generate the correction signal $V_{OFFSET}$.

8. The invention of claim 2, wherein the LDO regulator circuit further includes an error amplifier having a first differential input and a second differential input controlling the generation of the regulated voltage $V_{OUT}$, the first differential input configured to pass a current reduced by the offset current $I_{OFFSET}$ and the second differential input configured to pass a current increased by the offset current $I_{OFFSET}$.

9. The invention of claim 2, wherein the offset error correction circuit includes:
   (a) a sense field effect transistor (FET) configured to sense the load current LOAD through the LDO regulator circuit and generate a sense current $I_{SENSE}$ as a function of the load current $I_{LOAD}$; and
   (b) an offset current generator, coupled to the sense FET, configured to generate the offset current $I_{OFFSET}$ as a function of the sense current $I_{SENSE}$.

10. The invention of claim 9, wherein the offset current generator includes:
   (a) a current transform circuit coupled to the sense FET and configured to convert the sense current $I_{SENSE}$ to a sense voltage $V_{SENSE}$;
   (b) an analog-to-digital converter coupled to the current transform circuit and configured to convert a magnitude of the sense voltage $V_{SENSE}$ to a digital value comprising N bits; and
   (c) a digital-to-analog converter current generator coupled to the analog-to-digital converter and configured to convert the digital value comprising N bits to the offset current $I_{OFFSET}$.

11. The invention of claim 9, wherein the offset current generator includes a current mirror circuit coupled to the sense FET and configured to amplify the sense current $I_{SENSE}$ to the offset current $I_{OFFSET}$.

12. A low-dropout (LDO) regulator circuit including:
(a) an input for an unregulated voltage;
(b) an output for a regulated voltage $V_{OUT}$;
(c) an offset error correction circuit that generates an output comprising an offset current $I_{OFFSET}$ as a function of a load current $I_{LOAD}$ through the LDO regulator circuit;
(d) voltage regulation circuitry including an error amplifier coupled to the output of the offset error correction circuit and having a first differential input and a second differential input controlling the generation of the regulated voltage $V_{OUT}$, the first differential input configured to pass a current reduced by the offset current $I_{OFFSET}$ and the second differential input configured to pass a current increased by the offset current $I_{OFFSET}$, thereby substantially cancelling out variations in $V_{OUT}$ that would otherwise occur due to load regulation limitations of the LDO regulator circuit.

13. The invention of claim 12, wherein the offset error correction circuit includes:
(a) a sense field effect transistor (FET) configured to sense the load current LOAD through the LDO regulator circuit and generate a sense current $I_{SENSE}$ as a function of the load current $I_{LOAD}$; and
(b) an offset current generator, coupled to the sense FET, configured to generate the offset current $I_{OFFSET}$ as a function of the sense current $I_{SENSE}$.

14. The invention of claim 13, wherein the offset current generator includes:
(a) a current transform circuit coupled to the sense FET and configured to convert the sense current $I_{SENSE}$ to a sense voltage $V_{SENSE}$;
(b) an analog-to-digital converter coupled to the current transform circuit and configured to convert a magnitude of the sense voltage $V_{SENSE}$ to a digital value comprising N bits; and
(c) a digital-to-analog converter current generator coupled to the analog-to-digital converter and configured to convert the digital value comprising N bits to the offset current $I_{OFFSET}$.

15. The invention of claim 13, wherein the offset current generator includes a current mirror circuit coupled to the sense FET and configured to convert the sense current $I_{SENSE}$ to the offset current $I_{OFFSET}$.

\* \* \* \* \*